(12) United States Patent
Chang et al.

(10) Patent No.: US 12,463,135 B2
(45) Date of Patent: Nov. 4, 2025

(54) IC DIE FORMING METHOD AND IC DIE STRUCTURE

(71) Applicant: Elite Semiconductor Microelectronics Technology Inc., Hsinchu (TW)

(72) Inventors: Chih-Sheng Chang, Hsinchu (TW); Isaac Y. Chen, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 829 days.

(21) Appl. No.: 17/826,141

(22) Filed: May 26, 2022

(65) Prior Publication Data

US 2023/0387004 A1    Nov. 30, 2023

(51) Int. Cl.
*H01L 23/528*  (2006.01)
*H03K 17/08*  (2006.01)
*H10D 84/01*  (2025.01)

(52) U.S. Cl.
CPC .......... *H01L 23/528* (2013.01); *H03K 17/08* (2013.01); *H10D 84/01* (2025.01)

(58) Field of Classification Search
CPC ...... H01L 23/528; H03K 17/08; H10D 84/01; H03F 3/187; H03F 3/2173
See application file for complete search history.

(56) References Cited

U.S. PATENT DOCUMENTS

2010/0295138 A1 * 11/2010 Montanya Silvestre ............... H01L 24/05
257/415
2021/0033642 A1 * 2/2021 Hirano .................... G01R 3/00

FOREIGN PATENT DOCUMENTS

| CN | 110176532 A | * | 8/2019 | ............ H01L 23/28 |
| GB | 2386011 A | * | 9/2003 | ........... H03F 3/2171 |
| JP | 2005210692 A | * | 8/2005 | ........... H03F 3/2171 |
| WO | WO-2008059452 A1 | * | 5/2008 | ............ H03F 3/217 |
| WO | WO-2014132953 A1 | * | 9/2014 | ........... H03F 3/2171 |

* cited by examiner

Primary Examiner — Mohammed Shamsuzzaman
(74) Attorney, Agent, or Firm — Winston Hsu

(57) ABSTRACT

An integrated circuit die forming method, for forming a plurality of integrated circuit dies on a semiconductor wafer, comprising: forming a first device, a second device in a first die in a first area; forming a metal layer connected to the first device and the second device; forming a third device, a fourth device in a second die in a second area; forming the metal layer connected to the third device and the fourth device, wherein a scribe area exists between the first area and the second area is separated by; wherein the first device and the third device are used for synchronization and are components of a class D amplifier; wherein the second device is used for preventing leakage currents of the first die and the fourth device is used for preventing leakage currents of the second die.

18 Claims, 3 Drawing Sheets

IC DIE FORMING METHOD AND IC DIE STRUCTURE

BACKGROUND OF THE INVENTION

1. Field of the Invention

The present invention relates to an IC (Integrated Circuit) die forming method and an IC die structure, and particularly relates to an IC die forming method and an IC die structure which can prevent leakage current.

2. Description of the Prior Art

Conventionally, an IC package may comprise a plurality of IC dies. However, for some applications, the IC dies need to be separated to a plurality of single dies. In such case, the single dies may have leakage currents since some physical structures thereof are damaged. Therefore, some mechanisms are needed to prevent such leakage currents.

SUMMARY OF THE INVENTION

Therefore, one objective of the present invention is to provide an integrated circuit die forming method which can generate an integrated circuit die structure which can prevent leakage currents.

Another objective of the present invention is to provide an integrated circuit die structure which can prevent leakage currents.

An integrated circuit die forming method, for forming a plurality of integrated circuit dies on a semiconductor wafer, comprising: forming a first device, a second device in a first die in a first area; forming a metal layer connected to the first device and the second device; forming a third device, a fourth device in a second die in a second area; forming the metal layer connected to the third device and the fourth device, wherein a scribe area exists between the first area and the second area is separated by; wherein the first device and the third device are used for synchronization and are components of a class D amplifier; wherein the second device is used for preventing leakage currents of the first die and the fourth device is used for preventing leakage currents of the second die.

An integrated die structure which is generated by the above-mentioned integrated circuit die forming method is also disclosed.

In view of above-mentioned embodiments, the leakage currents of the dies can be prevented even if the dies are separated.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. The method in following descriptions can be executed by programs stored in a non-transitory computer readable recording medium such as a hard disk, an optical disc or a memory. Additionally, the term "first", "second", "third" in following descriptions are only for the purpose of distinguishing different one elements, and do not mean the sequence of the elements. For example, a first device and a second device only mean these devices can have the same structure but are different devices. Further, in following embodiments, the IC die structure is applied to a Class-D amplifier, but not limited.

Figure 1:
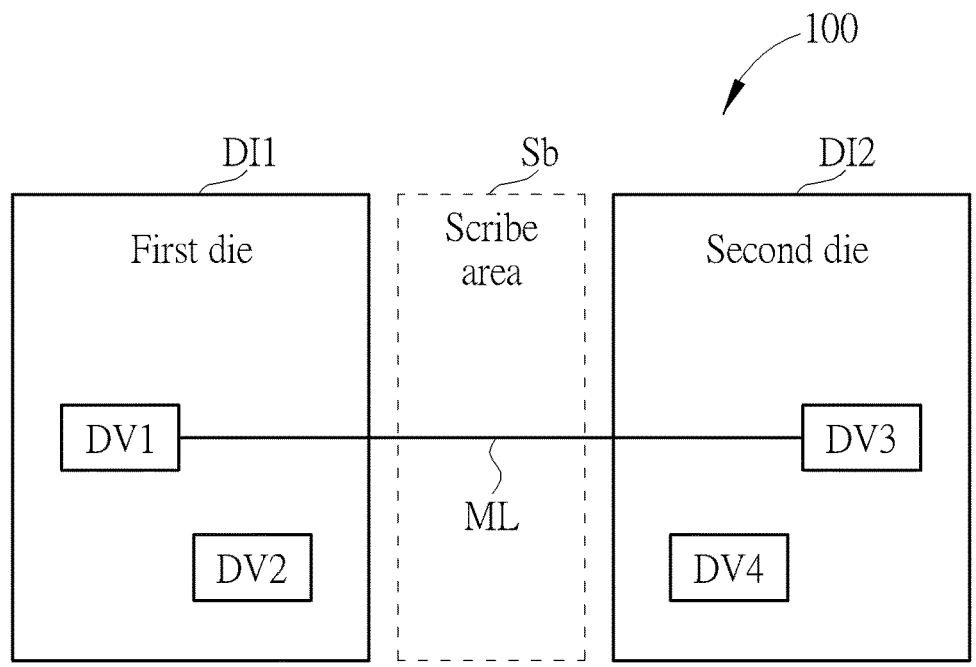
FIG. 1 is a block diagram illustrating an IC die structure according to one embodiment of the present invention.

FIG. 1 is a block diagram illustrating an IC die structure 100 according to one embodiment of the present invention. As illustrated in FIG. 1, the IC die structure 100 comprises a first die DI1 and a second die DI2. Also, the first die DI1 comprises a first device DV1 and a second device DV2, and the second die DI2 comprises a third device DV3 and a fourth device DV4. A metal line ML is provided between the first die DI1 and the second die DI2, configured to connect the first device DV1 and the third device DV3. The first device DV1 and the third device DV3 are used for synchronization and are components of a class D amplifier. Furthermore, the second device DV2 is configured to prevent leakage currents of the first die DI1 and the fourth device DV4 is configured to prevent leakage currents of the second die DI2.

In one embodiment, the first die DI1 is a transmitter, and the second die DI2 is a receiver. Also, in one embodiment, the first device DV1 is a clock generator and the third device DV3 is a triangular wave generator. In such case, the third device DV3 receives a clock signal generated by the first device DV1 and generates a triangular wave for the Class-D amplifier according to the clock signal. In one embodiment, the Class-D amplifier comprising the third device DV3 generates a PWM (Pulse Width Modulation) signal corresponding to the triangular wave generated by the third device DV3. By this way, the Class-D amplifier comprising the first device DV1 and the Class-D amplifier comprising the third device DV3 can be synchronized. Examples of detail structures of the second device DV2 and the fourth device DV4 will be described below.

In one embodiment, the IC die structure 100 further comprises a scribe area Sb. For some applications, the first die DI1 and the second die DI2 may be connected to each other and operate together. However, for some applications, the first die DI1 and the second die DI2 need to be separated. For example, the first die DI1 and the second die DI2 are used for two independent circuits which have no relation with each other. In such case, the scribe area Sb is cut such that the metal line ML is cut as well, thereby the first die DI1 and the second die DI2 are separated.

In one embodiment, the first die DI1 and the second die DI2 are not separated if the Class-D amplifier is applied to a stereo speaker. Also, the first die DI1 and the second die DI2 are separated if the Class-D amplifier is applied to a mono speaker.

Figure 2:
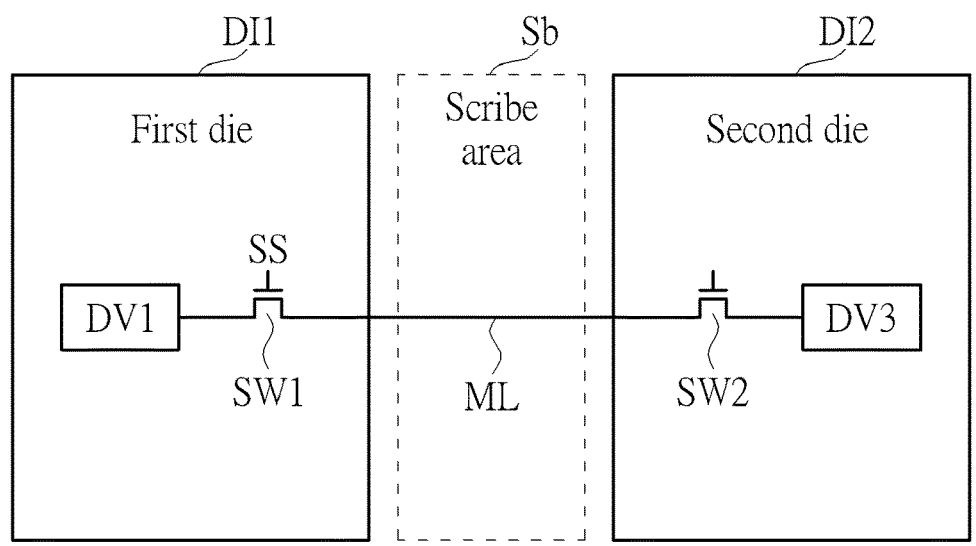
FIG. 2, FIG. 3, and FIG. 4 are circuit diagrams illustrating IC die structures with current leakage prevent mechanisms according to different embodiments of the present invention.
Figure 3:
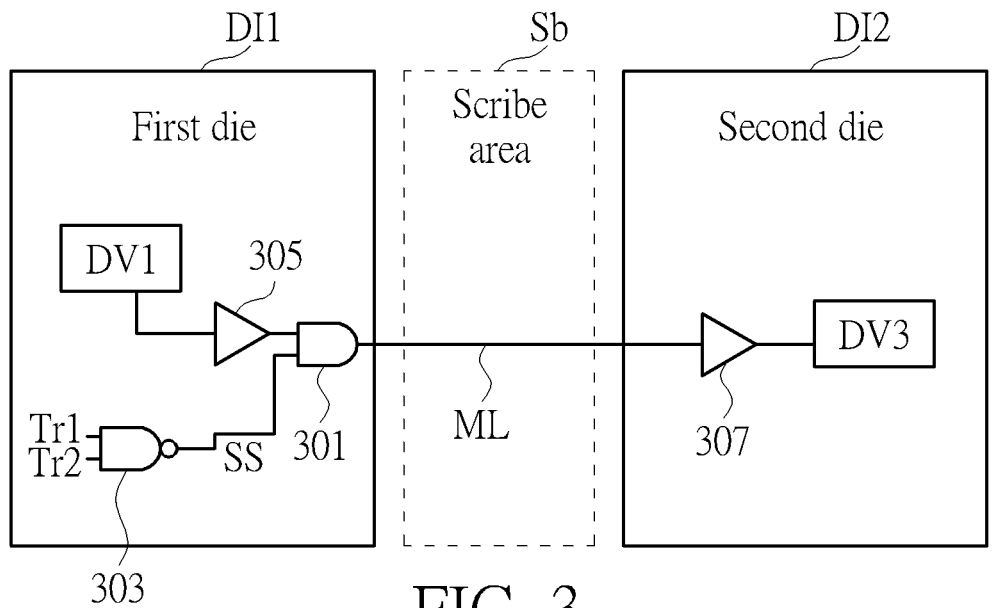
Figure 4:
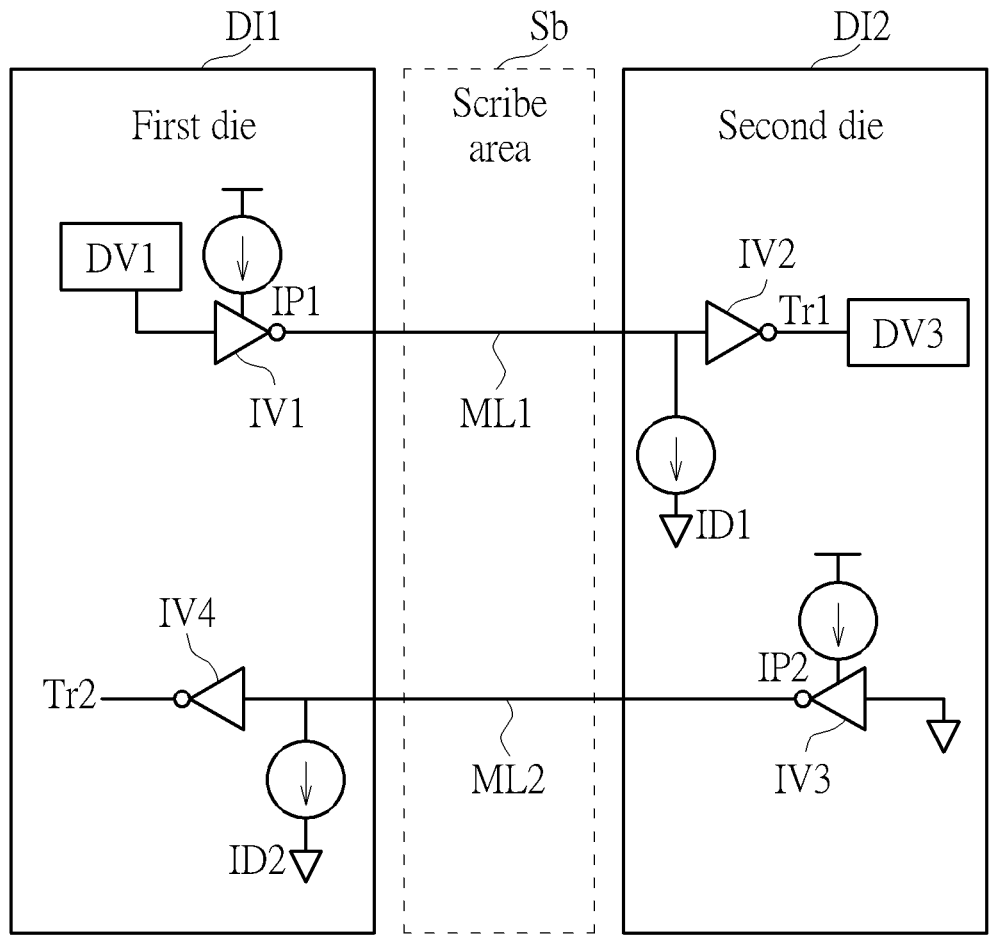

FIG. 2, FIG. 3, and FIG. 4 are circuit diagrams illustrating IC die structures with current leakage prevent mechanisms according to different embodiments of the present invention.

In following embodiments, the second device DV2 and the fourth device DV4 are applied to prevent the leakage currents occur after the first die DI1 and the second die DI2 are separated. The term "separated" mentioned here means the first die DI1 and the second die DI2 are cut and disconnected. However, the second device DV2 and the fourth device DV4 can be applied to prevent the leakage currents occur in any case rather than limited to the separation of the two dies. For example, the leakage currents may occur when the first die DI1 and the second die DI2 are connected and operate in a single IC, but operate in a sleep mode. It will be appreciated that in some following embodiments only the second device DV2 is taken as an example for explaining. The fourth device DV4 can comprise the same structures but illustrations thereof are omitted for brevity.

In the embodiment of FIG. 2, the second device DV2 comprises a switch circuit SW1 connected to the metal line ML, which can control conduction between the first die DI1 and the second die DI2. The switch circuit SW1 is controlled by a separation signal SS, turns off (non-conducted) while receiving the separation signal SS indicating that the first die DI1 and the second die DI2 are separated, and turns on (conducted) while receiving the separation signal SS indicating that the first die DI1 and the second die DI2 are not separated. In one embodiment, the switch circuit SW1 is a NMOSFET having a gate receiving the separation signal SS, but not limited.

In the embodiment of FIG. 3, the second device DV2 comprises a logic circuit, which can output a logic value corresponding to a control signal (e.g., the separation signal SS). As illustrated in FIG. 3, the logic circuit comprises an AND gate 301 which outputs a predetermined logic value 0 while receiving the separation signal SS indicating that the first die DI1 and the second die DI2 are separated. In the embodiment of FIG. 3, the first die DI1 further comprises an NAND gate 303, which receives trigger signals Tr1 and Tr2 to generate the separation signal SS. In one embodiment, the logic circuit further comprises buffer gates 305, 307, but not limited. The trigger signals Tr1 and Tr2 can be generated by various mechanisms and examples thereof will be described for more details later.

In the embodiment of FIG. 4, the second device DV2 comprises an inverter IV1, which can selectively output a first current and a second current smaller than the first current. In one embodiment, the output current of the inverter IV1 is controlled by a pull up current IP1 thereof. Specifically, the inverter IV1 outputs the first current when the first die DI1 and the second die DI2 are not separated, and outputs the second current when the first die DI1 and the second die DI2 are separated. By this way, the first die DI1 outputs a small current when the first die DI1 and the second die DI2 are separated, thus the leakage currents can be reduced.

Please note, in the embodiment of FIG. 4, the inverter IV1 is connected to a second inverter IV2, which has an input terminal coupled to a small pull down current ID1. However, the arrangement of the inverter IV1 is not limited to this example.

The inverter IV1 is applied to prevent leakage currents of the first die DI1. In one embodiment, the second device DV2 further comprises an inverter IV3 for preventing leakage currents of the second die DI2, and further comprises an inverter IV4 connected to inverter IV3. The inverters IV1 and IV2 are connected via a metal line ML1, and the inverters IV3 and IV4 are connected via a metal line ML2. The inverter IV3 receives a pull up current IP2 and the inverter IV4, which has an input terminal coupled to a small pull down current ID2. The operations of the inverters IV3, IV4 are the same of which of the inverters IV1, IV2.

Further, in this example, the trigger signals Tr1, Tr2 in FIG. 3 are respectively generated by the inverters IV2 and IV4. In such case, the logic values of the trigger signals Tr1, Tr2 change when the first die DI1 and the second die DI2 are separated, thus the logic value of the separation signal SS in FIG. 3 correspondingly changes. Also, in such case, the output currents of the inverters IV1, IV3 are changed to be smaller currents after the first die DI1 and the second die DI2 are separated. The change of the output currents can be triggered by any mechanism. For example, the change of the output currents can be triggered by a control signal responding the separation of the first die DI1 and the second die DI2. For another example, the change of the output currents can be manually triggered after the first die DI1 and the second die DI2 are separated.

As above-mentioned, the first device DV1 and the third device DV3 can be synchronized when the first die DI1 and the second die DI2 are not separated. Such mechanism can also be implemented by the embodiment illustrated in FIG. 4.

For more detail, if the first die DI1 and the second die DI2 are separated, the logic value of the trigger signal Tr1 is fixed at 1 via the small pull down current ID1 at the input terminal of the inverter IV2. By this way, the third device DV3 in the second die DI2 generates the triangular wave according to a clock signal from another source rather than according to the clock signal from the first device DV1 in the first die DI1. Following the same way, if the first die DI1 and the second die DI2 are separated, the logic value of the trigger signal Tr2 is fixed at 1 via the small pull down current ID2 at the input terminal of the inverter IV4. By this way, the first device DV1 in the first die DI1 does not generate the clock signal to the second die DI2. On the opposite, if the first die DI1 and the second die DI2 are not separated, the input of the inverter IV3 is 0, thus the output of the inverter IV3, which is 1, is transmitted to the inverter IV4 and overcomes the small pull down current ID2. By this way, the trigger signal Tr2 output by the inverter IV4 is 0, thereby the first device DV1 generates the clock signal to the second ide DI2 for synchronization.

Figure 5:
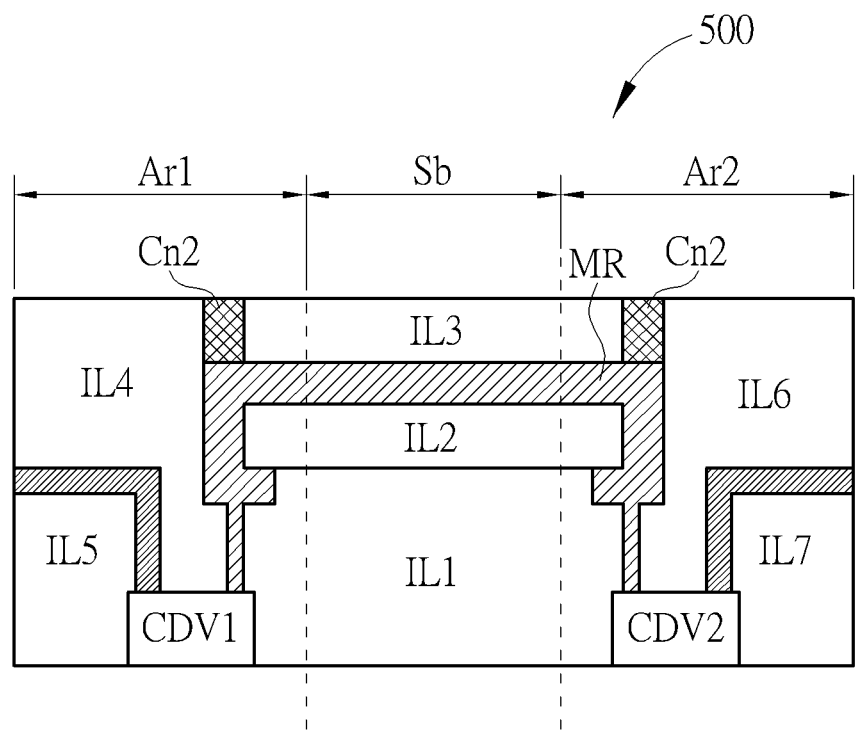
FIG. 5 is a cross sectional view of the IC die structure according to one embodiment of the present invention.

FIG. 5 is a cross sectional view of the IC die structure according to one embodiment of the present invention. Please note, the IC die structure provided by the present invention is not limited to comprising such cross sectional view. As shown in FIG. 5, the IC die structure 500 comprises components CDV1, CDV2, a metal layer MR (the metal lines ML, ML1, ML2 in above-mentioned embodiments), contacts Cn1, Cn2 and isolation layers IL1, IL2, IL3, IL4, IL5 and IL6. In one embodiment, the components CDV1, CDV2 respectively mean a component in the first device DV1 and the third device DV3, such as a transistor. However, the components CDV1, CDV2 can respectively mean the whole first device DV1 and the whole second device DV2. The component CDV1 is formed in a first area Ar1 and the component CDV2 is formed in a second area Ar2. The component of the second device DV2 can also be formed in the first area Ar1, and the component of the fourth device DV4 can also be formed in the second area Ar2. Also, the isolation layers IL1, IL2, IL3, IL4, IL5 and IL6 are insulation materials. As illustrated in FIG. 5, contacts Cn1, Cn2 and the isolation layer IL3 are provided above the metal layer MR. In such case, the metal lines ML, ML1, ML2 in above-mentioned embodiments are metal lines covered by other materials rather than meal wires between the first die DI1 and the second die DI2.

Figure 6:
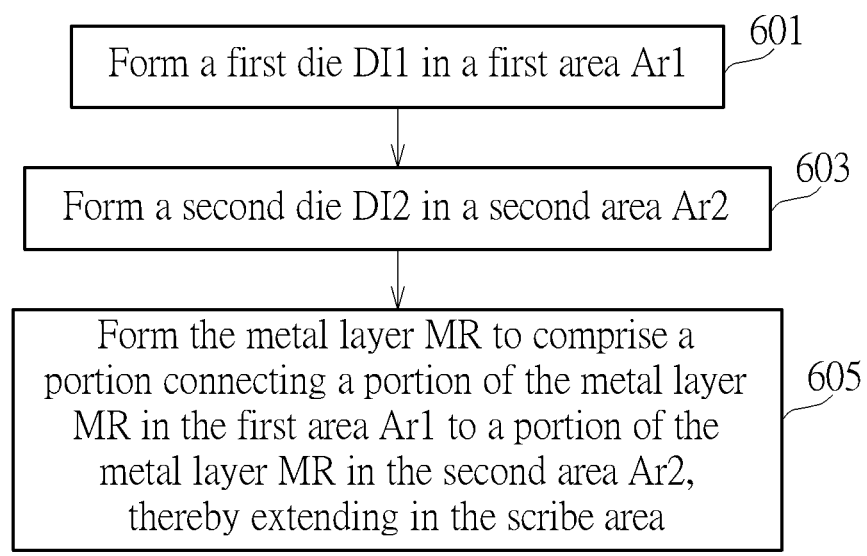
FIG. 6 is a flow chart illustrating an IC die forming method according to one embodiment of the present invention.

In view of above-mentioned embodiments, an IC die forming method can be acquired, which is used for forming a plurality of integrated circuit dies on a semiconductor wafer. FIG. 6 is an IC die forming method according to one embodiment of the present invention, which comprises following steps. Please refer to FIG. 1, FIG. 5 and FIG. 6 to understand the concepts of the present invention for more clarity.

Step 601

Form a first die DI1 in a first area Ar1.

For more detail, the step 601 comprises: forming a first device DV1 in the first area Ar1; forming a second device DV2 in the first area Ar1; and forming a metal layer MR connected to the first device DV1 and the second device DV2.

Step 603

Form a second die DI2 in a second area Ar2.

For more detail, the step 603 comprises: forming a third device DV3 in the second area Ar2; forming a fourth device DV4 in the second area Ar2; and forming the metal layer MR connected to the third device and the fourth device, wherein the first area Ar1 and the second area Ar2 are separated by a scribe area Sb.

Step 605

Form the metal layer MR to comprise a portion connecting a portion of the metal layer MR in the first area Ar1 to a portion of the metal layer MR in the second area Ar2, thereby extending in the scribe area.

The first device DV1 and the third device DV3 are used for synchronization and are components of a class D amplifier. As illustrated in FIG. 1, in one embodiment the first device DV1 is a clock generator and the third device DV3 is a triangular wave generator. In such case, the third device DV3 receives a clock signal generated by the first device DV1 and generates a triangular wave for the Class-D amplifier according to the clock signal. In one embodiment, the Class-D amplifier comprising the third device DV3 generates a PWM (Pulse Width Modulation) signal corresponding to the triangular wave generated by the third device DV3.

Additionally, the second device DV2 is used for preventing leakage currents of the first die DI1 and the fourth device DV4 is used for preventing leakage currents of the second die DI2.

Other detail steps can be acquired based upon above-mentioned embodiments. Therefore, descriptions thereof are omitted for brevity here.

In view of above-mentioned embodiments, the leakage currents of the dies can be prevented even if the dies are separated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit die forming method, for forming a plurality of integrated circuit dies on a semiconductor wafer, comprising:
   forming a first die in a first area, comprising:
   forming a first device in the first area;
   forming a second device in the first area; and
   forming a metal layer connected to the first device and the second device;
   forming a second die in a second area, comprising:
   forming a third device in the second area;
   forming a fourth device in the second area; and
   forming the metal layer connected to the third device and the fourth device, wherein a scribe area exists between the first area and the second area; and
   forming the metal layer to comprise a portion connecting a portion of the metal layer in the first area to a portion of the metal layer in the second area, thereby extending in the scribe area;
   wherein the first device and the third device are used for synchronization and are components of a class D amplifier;
   wherein the second device is used for preventing leakage currents of the first die and the fourth device is used for preventing leakage currents of the second die;
   wherein a first set of plurality of isolation layers covering the portion of the metal layer extended in the scribe area, a second set of plurality of isolation layers covering the portion of the metal layer in first area and the first device in the first area, a third set of plurality of isolation layers covering the portion of the metal layer in second area and the third device in the second area;
   wherein a plurality of contacts connecting the metal layer in the first area and the second area.

2. The integrated circuit die forming method of claim 1, wherein the first device is a clock generator and the third device is a triangular wave generator.

3. The integrated circuit die forming method of claim 1, further comprising:
   forming a switch circuit in the second device, wherein the switch circuit can control conduction between the first die and the second die.

4. The integrated circuit die forming method of claim 3, wherein the switch circuit turns off while receiving a separation signal indicating that the first die and the second die are separated.

5. The integrated circuit die forming method of claim 1, further comprising:
   forming a logic circuit in the second device, wherein the logic circuit can output a logic value corresponding to a control signal.

6. The integrated circuit die forming method of claim 5, wherein the control signal is a separation signal, wherein the logic circuit outputs a predetermined logic value while the separation signal indicating that the first die and the second die are separated.

7. The integrated circuit die forming method of claim 1, further comprising:
   forming an inverter in the second device, wherein the inverter can selectively output a first current and a second current smaller than the first current.

8. The integrated circuit die forming method of claim 7, wherein the inverter outputs the first current when the first die and the second die are not separated, and outputs the second current when the first die and the second die are not separated.

9. The integrated circuit die forming method of claim 1, further comprising:
   not separating the first die and the second die if the Class-D amplifier is applied to a mono speaker; and
   separating the first die and the second die if the Class-D amplifier is used for a binaural speaker.

10. An integrated circuit die structure, comprising:
    a first die, in a first area, comprising:

a first device in the first area;
a second device in the first area;
a metal layer, connected to the first device and the second device;
a second die, in a second area, comprising:
a third device in the second area;
a fourth device in the second area;
wherein the metal layer is further connected to the third device and the fourth device;
wherein a scribe area exists between the first area and the second area;
wherein the metal layer comprises a portion connecting a portion of the metal layer in the first area to a portion of the metal layer in the second area, thereby extending in the scribe area;
wherein the first device and the third device are used for synchronization and are components of a class D amplifier;
wherein the second device is used for preventing leakage currents of the first die and the fourth device is used for preventing leakage currents of the second die;
wherein a first set of plurality of isolation layers covering the portion of the metal layer extended in the scribe area, a second set of plurality of isolation layers covering the portion of the metal layer in first area and the first device in the first area, a third set of plurality of isolation layers covering the portion of the metal layer in second area and the third device in the second area;
wherein a plurality of contacts connecting the metal layer in the first area and the second area.

11. The integrated circuit die structure of claim 10, wherein the first device is a clock generator and the third device is a triangular wave generator.

12. The integrated circuit die structure of claim 10, further comprising:

a switch circuit in the second device, wherein the switch circuit can control conduction between the first die and the second die.

13. The integrated circuit die structure of claim 12, wherein the switch circuit turns off while receiving a separation signal indicating that the first die and the second die are separated.

14. The integrated circuit die structure of claim 10, further comprising:

a logic circuit in the second device, wherein the logic circuit can output a logic value corresponding to a control signal.

15. The integrated circuit die structure of claim 14, wherein the control signal is a separation signal, wherein the logic circuit outputs a predetermined logic value while the separation signal indicating that the first die and the second die are separated.

16. The integrated circuit die structure of claim 10, further comprising:

an inverter in the second device, wherein the inverter can selectively output a first current and a second current smaller than the first current.

17. The integrated circuit die structure of claim 16, wherein the inverter outputs the first current when the first die and the second die are not separated, and outputs the second current when the first die and the second die are not separated.

18. The integrated circuit die structure of claim 10,
wherein the first die and the second die are not separated if the Class-D amplifier is applied to a mono speaker; and
wherein the first die and the second die are separated if the Class-D amplifier is used for a binaural speaker.

* * * * *